United States Patent [19]

Brooks

[11] 4,231,150
[45] Nov. 4, 1980

[54] METHOD OF TUNING A FLYBACK TRANSFORMER FOR MINIMUM RINGING

[75] Inventor: Forrest E. Brooks, Raleigh, N.C.

[73] Assignee: Telex Computer Products, Inc., Raleigh, N.C.

[21] Appl. No.: 966,511

[22] Filed: Dec. 4, 1978

[51] Int. Cl.³ .............................................. H01F 41/02
[52] U.S. Cl. .................................... 29/593; 29/602 R; 29/606; 336/119
[58] Field of Search ..................... 29/602 R, 593, 606; 336/117, 119, 120, 129; 324/55

[56] References Cited
U.S. PATENT DOCUMENTS

| 2,417,188 | 3/1947 | Clark | 336/129 X |
| 4,010,536 | 3/1977 | Fujita et al. | 29/593 |

Primary Examiner—Carl E. Hall
Attorney, Agent, or Firm—Head & Johnson

[57] ABSTRACT

The method of tuning a flyback transformer in a cathode ray tube control system, for minimum ringing, which comprises the steps of adjusting the lateral position of the center plane of the high voltage or secondary coil, with respect to the center plane of the low voltage or primary coil, placing an electric sensor in the vicinity of the high voltage coil to pick up a signal, which is a function of the current in the high voltage coil, and applying that signal to an oscilloscope, and noting the change in amplitude of the ringing component of the signal as a function of the lateral displacement between the two coils. By this means, the selected relative position of the two coils which provides a minimum amplitude of ringing is found and the coils are locked in that relative position to each other and to the magnetic core.

2 Claims, 4 Drawing Figures

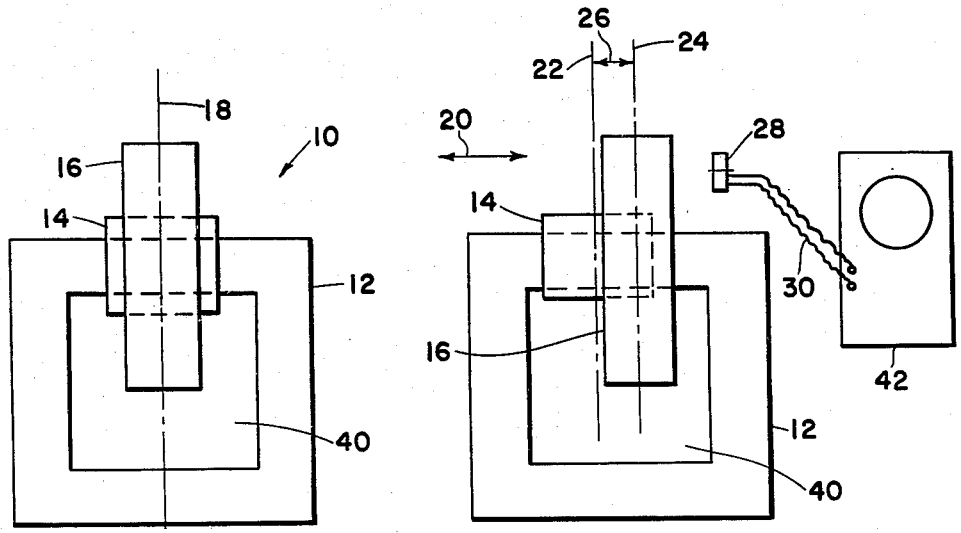
Fig. 1
(PRIOR ART)
Fig. 2
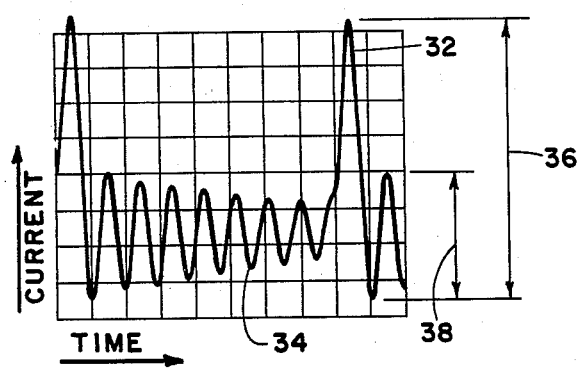
Fig. 3
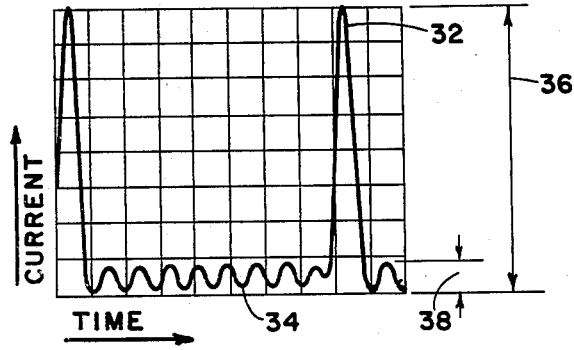
Fig. 4

METHOD OF TUNING A FLYBACK TRANSFORMER FOR MINIMUM RINGING

BACKGROUND OF THE INVENTION

1. Field of the Invention

This invention lies in the field of cathode ray tube technology. More particularly, it involves a method of adjustment of the flyback transformer in the cathode ray tube control system, to provide optimum tuning of the transformer, such that there will be a minimum of ringing or oscillatory signal in the voltage wave-form in the high voltage coil.

2. Description of the Prior Art

It is well known that the flyback transformers in video devices such as TVs, display terminals, etc. can be tuned to provide maximum efficiency, and high voltage, as well as to avoid a curtain effect in the raster, due to oscillations or ringing in the voltage generated.

The degree of tuning is easily observed by viewing the high voltage wave-form on a cathode ray oscilloscope. Optimum tuning is obtained by minimizing the amplitude of ringing, which appears on the base line of the wave-form. When the ringing frequency is the third harmonic of the frequency of the principal peak of the high voltage wave-form, optimum tuning is realized.

This tuning has been accomplished in a variety of ways in the prior art. One popular method involves controlling the size and shape of the high voltage coil. This approach controls high voltage coil leakage inductance and capacitance. Tuning can also be accomplished by changing the dimension of the air gap in the core, to control the fundamental flyback frequency.

Although both of these methods are fairly effective in flyback tuning, they are both cumbersome, and each has certain limits. For example, in the control by varying the dimensions of the high voltage coil, these parameters must be optimized by a procedure of successive approximations. Once the dimensions are chosen, they must be held closely in production, or coils will not be useable.

So far as gap changes in the core are concerned, this procedure can be performed by removing the flyback core and testing various thicknesses of the gap material between the core halves. However, the primary inductance must be optimized specifically for tuning. Since it cannot be optimized for minimum transformer current and best core flux density, maximum circuit efficiency cannot be realized.

SUMMARY OF THE INVENTION

It is a primary object of this invention to provide a method of adjustment and testing of a flyback transformer so as to ensure that the operation will be such that the oscillations or ringing in the base line of voltage in the high voltage coil will be a minimum.

These and other objects are realized and the limitations of the prior art are overcome in this invention by placing an electric field sensor in the vicinity of the high voltage coil. This should be at such a distance that a pickup signal can be induced into the sensor, while the sensor is far enough away from the high voltage coil, so as not to affect its normal leakage inductance and capacitance. The signal induced into the sensor is displayed on a cathode ray oscilloscope. By use of a pair of insulating tongs, the high voltage coil is moved longitudinally, that is, perpendicular to the central plane of the primary and secondary coils. When there is a selected spacing between the planes of the primary and secondary coils, the signal displayed on the oscilloscope will show a minimum amplitude of oscillation, or ringing.

In order to get maximum range of displacement between the two coils, it is convenient to move the primary coil off-center, that is, close to one edge of the window within the core. In this way, the secondary coil may be moved from a position where it is symmetrical with respect to the primary coil, to one in which it overhangs one end of the primary coil, without itself being too close to the sides of the window in the core. If the secondary or high voltage coil is too close to the edge of the window, that is, close to the side of the core, that there is a probability of voltage breakdown between high voltage coil and core.

BRIEF DESCRIPTION OF THE DRAWINGS

These and other objects and advantages of this invention and a better understanding of the principles and details of the invention, will be evident from the following description, taken in conjunction with the appended drawings, in which:

FIG. 1 represents the prior art arrangement of primary or low voltage and secondary, or high voltage, coils, on the core of a flyback transformer.

FIG. 2 illustrates the operating position of the primary and secondary coils for optimum tuning.

FIGS. 3 and 4 show cathode ray oscilloscope displays of the pick-up signal, from the high voltage coil, under conditions of untuned and tuned coil positions of the coils.

DESCRIPTION OF THE PREFERRED EMBODIMENT

Referring now to the drawings, FIG. 1 shows, indicated generally by the numeral 10, a conventional flyback transformer with its primary coil 14 and its secondary coil 16 centered, one with respect to the other, and both with respect to the window 40 of the core 12. Line 18 represents the central plane of both coils 14, 16.

No detail need be provided for the flyback transformer as shown in FIG. 1, since this is a standard commercial item, and is sold off-the-shelf. It is fully described in textbooks and literature, such as, for example, on pages 70-73 of the *RCA Transistor Manual*, published by the Radio Corporation of America and available at electronics supply stores.

No attempt has been made to describe the electronic circuits in which these flyback transformers are used since they are fully described in the literature and in the circuit diagrams of T.V. sets, etc. Such circuits are clearly displayed and described in the *RCA Transistor Manual*.

In common practice, the current that flows through the primary of a flyback transformer, flows through an inductance, and increases linearly with time on a ramp. This current also flows through the horizontal deflection coil of the cathode ray tube. If there are oscillations or ringing in this current, then there will be corresponding variations in the rate of rise of current through the deflection coil, and the displacement of the cathode ray tube across the screen will not be linear with time. Consequently, it is important to minimize the amplitude of any oscillation, or ringing of current in the primary and secondary coils during the period that current is building up through the deflection coil.

I have found that the tuning, or the magnitude of the ringing, in the current of the high voltage coil is a function of the leakage inductance of the primary coil and the secondary coil, and their mutual capacitance and the capacitance to ground of both coils. This leakage flux is the flux which links one coil, but does not link with the other coil. By changing the position of the high voltage coil with respect to the primary coil, the percentage of high voltage coil flux linking the primary coil, and also the capacitance of the high voltage coil, to the primary coil, and to ground, can be adjusted.

The important factor in coil positioning is the distance 26 between the centers of mass, or the median planes, of the two coils 22,24, as viewed from the edge. This is shown in FIG. 2 where the primary coil 14 has been moved off-center, and the high voltage coil 16 has been moved relative to the primary, so that their median planes 22 and 24, respectively, are separated by a selected distance 26.

Double-headed arrow 20 indicates that the high voltage coil 16 is displaced back and forth with respect to the primary coil 14 during a period of testing, in which a sensor, indicated by the numeral 28, is positioned in the vicinity of, but not too close to, the high voltage coil. The signal generated in the coil 28 and appearing on its leads 30, is carried to an oscilloscope and displayed, while the flyback transformer is connected into its operating system.

Referring now to FIGS. 3 and 4, there are shown two displays taken from the oscilloscope 42. The display shows a single oscillatory peak 32, the amplitude of which is indicated by arrow 36, as extending from the peak to the trough. In between adjacent peaks 32 is a series of oscillations of higher frequency than the principal peaks 32 and of lesser amplitude. This oscillatory portion 34 of the signal is called ringing, and should be minimized, since the magnitude of ringing in FIG. 3 would provide a non-linear time base for the deflection coil of the cathode ray tube system, as well as consuming electrical energy.

By observing the display, such as in FIGS. 3 and 4, as the secondary coil 16 is moved laterally with respect to the primary coil 14, a relative position of the two coils is found of spacing 26, where the ringing is a minimum as shown in FIG. 4. The best tuning is arrived at when the frequency of the ringing is the third harmonic of the frequency of the peak voltage 32.

The important factor in coil positioning is distance 26 between the central planes of the two coils as viewed from the edge. In carrying out the test, the primary coil can be positioned off-center and locked. The locking can be by mechanical means, or by the use of a cement which can be applied between the coil and the core to immobilize the coil. The high voltage coil is then moved laterally back and forth until a selected position is found for which amplitude of ringing is minimized. Then the two coils are locked together.

This type of testing need not be carried out on each flyback transformer after installation in the cathode ray tube system. However, once the lateral dimension 26 has been found for a set of coils and core which are standard, then successive flyback transformers can be mounted with their coils in the precise same position to provide the same minimum ringing.

As seen in FIGS. 3 and 4, considerable improvement in the reduction of amplitude of the ringing current can be obtained by proper tuning. In FIG. 3, the ringing ratio, that is, the ratio between the amplitude 36 of the large peak 32, to the amplitude 38 of the ringing signal 34, can be reduced from an initial value of 8 to 3.5, to a tuned ratio of 8 to 1.

It will be clear that a mechanical means, such as a threaded rod of insulating material, can be used to relatively move the high voltage coil with respect to the low voltage coil, and to lock them relatively together. Also, after the transformer has been tested, and the relative spacing between the two coils is known, they can be precisely positioned and locked, relative to each other.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

I claim:

1. The method of optimizing a flyback transformer in a cathode ray tube control system for minimum ringing, comprising the steps of;
    (a) placing in said system a standard flyback transformer having a core, a primary or low voltage coil, and a secondary or high voltage coil;
    (b) placing a suitable sensor in the vicinity of said high voltage coil to pick up a signal, which is a function of the voltage waveshape in said high voltage coil, and displaying said pickup signal on a cathode ray oscilloscope;
    (c) positioning said primary at a selected position, and relatively displacing and adjusting the central plane of said high voltage coil laterally with respect to the central plane of said primary coil, while noting the amplitude of ringing in said pickup signal, until a selected relative position is reached, where said ringing is a minimum; and
    (d) locking said high voltage and low voltage coils against relative lateral movement at said selected position with respect to each other and to said core.
    whereby said flyback transformer will be tuned for minimum ringing.

2. The method as in claim 1 including the step, between steps (b) and (c), of shifting said primary or low voltage coil longitudinally along said core until it is off-center a selected distance;
    whereby a greater relative displacement between the center planes of said primary and secondary coils is possible.

* * * * *